(12) United States Patent
Sivakumar

(10) Patent No.: US 7,265,431 B2
(45) Date of Patent: Sep. 4, 2007

(54) IMAGEABLE BOTTOM ANTI-REFLECTIVE COATING FOR HIGH RESOLUTION LITHOGRAPHY

(75) Inventor: Swaminathan Sivakumar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 180 days.

(21) Appl. No.: 10/150,197

(22) Filed: May 17, 2002

(65) Prior Publication Data

US 2003/0213968 A1 Nov. 20, 2003

(51) Int. Cl.
 *H01L 31/0232* (2006.01)
 *H01L 31/06* (2006.01)
(52) U.S. Cl. ...................... 257/437; 257/464
(58) Field of Classification Search .......... 257/98, 257/290, 437, 464
 See application file for complete search history.

(56) References Cited

U.S. PATENT DOCUMENTS

| | | | | |
|---|---|---|---|---|
| 4,332,880 A | * | 6/1982 | Izu et al. | 430/272.1 |
| 4,910,122 A | * | 3/1990 | Arnold et al. | 430/313 |
| 5,387,498 A | * | 2/1995 | Ellis | 430/353 |
| 5,827,437 A | * | 10/1998 | Yang et al. | 216/77 |
| 5,879,863 A | * | 3/1999 | Azuma et al. | 430/322 |
| 6,039,888 A | * | 3/2000 | Ha et al. | 216/13 |
| 6,103,632 A | * | 8/2000 | Kumar et al. | 438/717 |
| 6,242,164 B1 | * | 6/2001 | Choi et al. | 430/325 |
| 6,242,344 B1 | * | 6/2001 | Koh et al. | 438/638 |
| 6,255,717 B1 | * | 7/2001 | Babcock et al. | 257/640 |
| 6,265,751 B1 | * | 7/2001 | Plat et al. | 257/437 |
| 6,309,789 B1 | * | 10/2001 | Takano et al. | 430/270.1 |
| 6,319,651 B1 | * | 11/2001 | Holmes et al. | 430/270.1 |
| 6,319,821 B1 | * | 11/2001 | Liu et al. | 438/636 |
| 6,329,117 B1 | * | 12/2001 | Padmanaban et al. | 430/270.1 |
| 6,503,845 B1 | * | 1/2003 | Nallan | 438/714 |
| 6,555,431 B1 | * | 4/2003 | Xing et al. | 438/253 |
| 6,583,047 B2 | * | 6/2003 | Daniels et al. | 438/623 |
| 6,586,156 B2 | * | 7/2003 | Angelopoulos et al. | 430/270.1 |
| 6,624,068 B2 | * | 9/2003 | Thakar et al. | 438/654 |
| 6,696,216 B2 | * | 2/2004 | Li et al. | 430/270.1 |
| 6,699,641 B1 | * | 3/2004 | Hellig et al. | 430/312 |
| 6,767,692 B1 | * | 7/2004 | Young et al. | 430/311 |
| 6,798,065 B2 | * | 9/2004 | Hsia et al. | 257/750 |
| 6,844,131 B2 | * | 1/2005 | Oberlander et al. | 430/270.1 |
| 6,921,723 B1 | * | 7/2005 | Lee et al. | 438/710 |
| 7,067,419 B2 | * | 6/2006 | Huang et al. | 438/638 |
| 2002/0022196 A1 | * | 2/2002 | Pavelchek et al. | 430/311 |
| 2002/0090832 A1 | * | 7/2002 | Koh et al. | 438/781 |
| 2002/0173160 A1 | * | 11/2002 | Keil et al. | 438/717 |
| 2003/0118736 A1 | * | 6/2003 | Jung et al. | 427/385.5 |
| 2003/0153190 A1 | * | 8/2003 | Gilton et al. | 438/694 |
| 2004/0014290 A1 | * | 1/2004 | Yang et al. | 438/288 |
| 2004/0121579 A1 | * | 6/2004 | Huang et al. | 438/622 |

OTHER PUBLICATIONS

Derwent-Acc-No. 2003-026401, Derwent-Week 200302, Copyright 1999 Derwent Information Ltd.*

* cited by examiner

*Primary Examiner*—Ida M. Soward
(74) *Attorney, Agent, or Firm*—Trop, Pruner & Hu, P.C.

(57) ABSTRACT

A semiconductor wafer may be coated with an imageable anti-reflective coating. As a result, the coating may be removed using the same techniques used to remove overlying photoresists. This may overcome the difficulty of etching anti-reflective coatings using standard etches because of their poor selectivity to photoresist and the resulting propensity to cause integrated circuit defects arising from anti-reflective coating remnants.

7 Claims, 1 Drawing Sheet

IMAGEABLE BOTTOM ANTI-REFLECTIVE COATING FOR HIGH RESOLUTION LITHOGRAPHY

BACKGROUND

This invention relates generally to semiconductor integrated circuits and, particularly, to lithographic techniques for patterning and defining structures on integrated circuits.

Integrated circuits may be manufactured by processes that use lithography. Generally, lithography involves exposing a surface to create a mask on a semiconductor structure. That mask may then be utilized to form desired structures in or over the semiconductor structure.

Commonly, the mask may be defined in a photoresist that is exposed to light. Photoresist may be either positive or negative photoresist. Positive photoresist becomes more soluble when exposed and negative photoresist becomes less soluble when exposed. Thus, by exposing a photoresist through a selective light pattern, some regions of the photoresist may be exposed while others are not. As a result, the solubility of the exposed regions is different from the solubility of the unexposed regions. This difference in solubility may be utilized to create a mask on the semiconductor structure to define features therein, for example, by etching.

One issue with photolithography is that there may be reflection from the underlying semiconductor structure during exposure that alters the effectiveness of the photoresist. To overcome this problem, a bottom antireflective coating (organic bottom ARC) substrate may be utilized. In such case, the substrate is coated with an anti-reflective coating.

Organic bottom ARCs may be very difficult to completely etch using standard etch techniques, with relatively poor selectivity to photoresist and a propensity to cause defects. For example, in some cases, a portion of the bottom ARC may remain after processing. This may cause a defect in the resulting product.

Because of the relatively low selectivity to photoresist, the etching used to remove the ARC may result in higher resist erosion rates during the ARC etch. The higher erosion rates may result in poor etch profiles and micromasking defects caused by incomplete removal of the ARC during the subsequent substrate etch.

Thus, there is a need for anti-reflective coated substrates that have more readily removable anti-reflective coatings.

DETAILED DESCRIPTION

Figure 1:
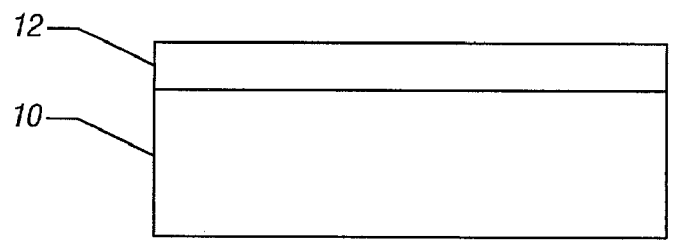
FIG. 1 is an enlarged cross-sectional depiction of one embodiment of the present invention.

In accordance with some embodiments of the present invention, a bottom anti-reflective coated semiconductor structure 10, shown in FIG. 1 may include a antireflective coating 12 that is imageable. In other words, the coating 12 may be photodefinable. Since the coating 12 is photodefinable, there is no need to conventionally etch the coating 12 in order to remove it.

The coating 12 may be made photodefinable in the same way that photoresist layers are made photodefinable. For example, positive photoresists commonly use diazo oxides or compounds that have an $N_2$ group bonded to an organic molecule. Exposing the photoresist to light leads to disassociation. Similarly, negative photoresists may use polyisoprene which loses solubility when exposed. Another technique for making a photodefinable or imageable compound is to use compounds that generate a photo acid upon exposure that catalyzes a deblocking reaction causing the resin in the exposed areas to dissolve in the developer.

A variety of chemistries may be utilized to form photoresist. The same chemistries may be commonly utilized to form a photosensitive anti-reflective coating 12 on a semiconductor structure 10, such as a silicon substrate. The coating 12 may be spun-on at odd multiples of the thickness needed to cause destructive interference at one-quarter wavelengths of light, in some embodiments.

In some embodiments, a second photoresist film may be utilized as the anti-reflective coating 12. The second photoresist film may be chosen for its anti-reflection properties and its ability to meet any planarizing properties useful in some anti-reflective coatings.

In some embodiments, the coating 12 may be pre-formed on a wafer forming the structure 10. In other embodiments, the coating 12 may be applied independently to the wafer including the structure 10.

Figure 2:
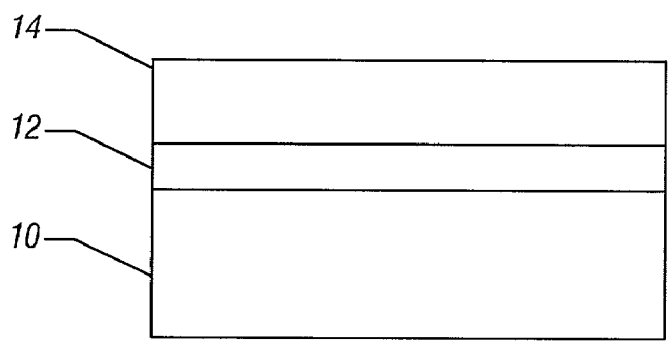
FIG. 2 is an enlarged cross-sectional view of the embodiment shown in FIG. 1 after subsequent processing.
Figure 3:
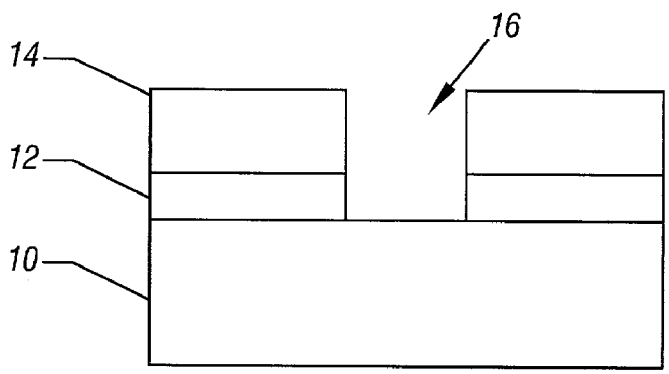
FIG. 3 is an enlarged cross-sectional view of the embodiment shown in FIG. 2 after subsequent processing.

Referring to FIG. 2, a photoresist 14 may be spun-on over the coating 12. Then, the photoresist 14 and the coating 12 may be exposed to radiation, such as light, and developed. The exposed material may be removed, in a positive photoresist example, to form an open area 16 through both the photoresist 14 and the coating 12.

In some embodiments, the exposure and removal of both the photoresist 14 and coating 12 may be done in one step. In other embodiments, it may be desirable to expose the photoresist 14 and remove the photoresist 14 where exposed (in a positive photoresist example). Subsequently the anti-reflective coating 12 may be exposed and removed using the same techniques utilized independently for photoresist removal.

Figure 4:
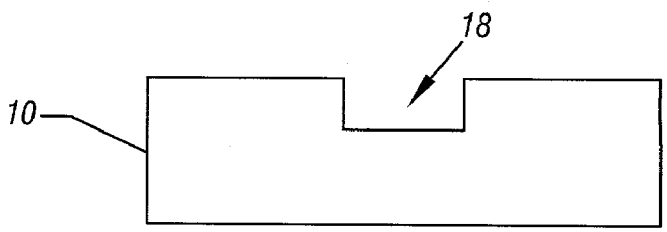
FIG. 4 is an enlarged cross-sectional view of the embodiment shown in FIG. 3 after subsequent processing.

Finally, referring to FIG. 4, once the photoresist 14 and coating 12 have been patterned, they may be utilized as an etch mask, in one embodiment, to form the aperture 18, shown in FIG. 4. Thereafter, both the photoresist 14 and the coating 12 may be removed.

In some embodiments, the thickness of the coating 12 may be selected to induce destructive interference between the illumination incident on the coating 12 and the light reflected from the semiconductor structure 10. This thickness may be formed in one spin-on coating or may be the result of a series of successive spin-on coatings in some embodiments.

Another technique to reduce reflections from the substrate is to adjust the absorption of the ARC material itself to reduce the reflectivity of the substrate and to reduce standing wave generation within the ARC. This approach is possible where the ARC is photosensitive.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A semiconductor wafer comprising:
   a semiconductor structure;

a photodefinable anti-reflective coating on said semiconductor structure, said coating formed of photoresist and including layers with thicknesses to cause destructive interference with incident light; and photoresist over said photodefinable anti-reflective coating.

2. The wafer of claim 1 wherein said semiconductor structure includes a silicon substrate.

3. The wafer of claim 1 wherein said photodefinable anti-reflective coating is more readily removed where exposed than where unexposed.

4. An integrated circuit comprising:

a semiconductor structure;

a photodefinable anti-reflective coating on said semiconductor structure, said coating formed of photoresist and including layers with thicknesses to cause destructive interference with incident light; and photoresist over said photodefinable anti-reflective coating.

5. The circuit of claim 4 wherein said semiconductor structure is silicon.

6. The circuit of claim 4 wherein said photodefinable anti-reflective coating is more readily removed in regions exposed to light than in regions unexposed to light.

7. The circuit of claim 4 wherein said circuit is in the form of an integrated circuit die.

* * * * *